(12) United States Patent
Kronholz et al.

(10) Patent No.: US 8,377,786 B2
(45) Date of Patent: Feb. 19, 2013

(54) METHODS FOR FABRICATING SEMICONDUCTOR DEVICES

(75) Inventors: Stephan-Detlef Kronholz, Dresden (DE); Peter Javorka, Radeburg (DE); Roman Boschke, Dresden (DE)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 13/020,369

(22) Filed: Feb. 3, 2011

(65) Prior Publication Data

US 2012/0202326 A1    Aug. 9, 2012

(51) Int. Cl.
*H01L 21/311*    (2006.01)
*H01L 21/3115*   (2006.01)

(52) U.S. Cl. ................. 438/303; 257/E21.409

(58) Field of Classification Search .......... 438/299, 438/301, 303; 257/E21.409, E21.443
See application file for complete search history.

(56) References Cited

U.S. PATENT DOCUMENTS

| | | | | |
|---|---|---|---|---|
| 5,935,873 A | * | 8/1999 | Spuler et al. | 438/710 |
| 6,004,837 A | * | 12/1999 | Gambino et al. | 438/157 |
| 6,303,420 B1 | * | 10/2001 | Sridhar et al. | 438/202 |
| 8,236,678 B2 | * | 8/2012 | Yelehanka et al. | 438/585 |
| 2005/0014353 A1 | * | 1/2005 | Mansoori et al. | 438/592 |
| 2005/0181591 A1 | * | 8/2005 | Tsuno | 438/597 |
| 2005/0242376 A1 | * | 11/2005 | Chen et al. | 257/214 |
| 2005/0287823 A1 | * | 12/2005 | Ramachandran et al. | 438/791 |
| 2007/0045729 A1 | * | 3/2007 | Hoentschel et al. | 257/344 |
| 2007/0224808 A1 | * | 9/2007 | Chang et al. | 438/649 |
| 2010/0233864 A1 | * | 9/2010 | Lee et al. | 438/306 |

* cited by examiner

*Primary Examiner* — Hsien Ming Lee
*Assistant Examiner* — Michele Fan
(74) *Attorney, Agent, or Firm* — Ingrassia Fisher & Lorenz, P.C.

(57) ABSTRACT

Embodiments of methods for fabricating the semiconductor devices are provided. The method includes forming a layer of spacer material over a semiconductor region that includes a first gate electrode structure and a second gate electrode structure. Carbon is introduced into a portion of the layer covering the semiconductor region about the first gate electrode structure or the second gate electrode structure. The layer is etched to form a first sidewall spacer about the first gate electrode structure and a second sidewall spacer about the second gate electrode structure.

16 Claims, 3 Drawing Sheets

METHODS FOR FABRICATING SEMICONDUCTOR DEVICES

FIELD OF THE INVENTION

The present invention relates generally to methods for fabricating semiconductor devices, and more particularly relates to methods for fabricating semiconductor devices by forming sidewall spacers that may be used, for example, as ion implantation masks for forming the source and drain extensions and Halo implants of the transistors.

BACKGROUND OF THE INVENTION

The majority of present day integrated circuits (ICs) are implemented by using a plurality of interconnected field effect transistors (FETs), also called metal oxide semiconductor field effect transistors (MOSFETs), or simply MOS transistors. A FET includes a gate electrode structure as a control electrode and spaced apart source and drain electrodes between which a current can flow. A control voltage applied to the gate electrode structure controls the flow of current through a channel region between the source and drain electrodes.

The gain of an MOS transistor, usually defined by the transconductance ($g_m$), is proportional to the mobility ($\mu$) of the majority carrier in the transistor channel. The current carrying capability and hence the performance of a MOS transistor is proportional to the transconductance times the width of the channel region divided by the length of the channel region ($g_m W/l$). The mobility of holes, the majority carrier in a P-channel MOS (PMOS) transistor, and the mobility of electrons, the majority carrier in an N-channel MOS (NMOS) transistor, are at least partially dependent upon the width and length of their corresponding channel regions that are defined by the position of the corresponding source and drain regions including the source and drain extensions and Halo implants. Typically, the source and drain extensions and Halo implants are positioned adjacent to and offset from their corresponding gate electrode structures using sidewall spacers or offset spacers as ion implantation masks. However, current manufacturing methods typically form the sidewall spacers for the PMOS transistors and the NMOS transistors such that the widths of the sidewall spacers, which define the offset of the source and drain extensions and Halo implants from their respective gate electrode structures, are essentially the same. Performance and design requirements vary for a variety of different IC applications. It would be desirable for some of these applications to have the flexibility to use sidewall spacers with different widths to form, for example, source and drain extensions and Halo implants defining dimensionally different channel regions for some or all of the MOS transistors, such as, for some or all of the PMOS transistors and/or for some or all of the NMOS transistors.

Accordingly, it is desirable to provide methods for fabricating semiconductor devices by forming sidewall spacers with different widths. Moreover, it is desirable to provide methods for fabricating semiconductor devices using sidewall spacers with different widths to form the source and drain extensions and Halo implants for some or all of the MOS transistors to define dimensionally different channel regions. Furthermore, other desirable features and characteristics of the present invention will become apparent from the subsequent detailed description and the appended claims, taken in conjunction with the accompanying drawings and the foregoing technical field and background.

SUMMARY OF THE INVENTION

Methods for fabricating semiconductor devices are provided herein. In accordance with an exemplary embodiment, a method for fabricating a semiconductor device is provided that includes forming a layer of spacer material over a semiconductor region that includes first and second gate electrode structures. Carbon is introduced into a portion of the layer covering the semiconductor region about the first gate electrode structure or the second gate electrode structure. The layer is etched to form a first sidewall spacer about the first gate electrode structure and a second sidewall spacer about the second gate electrode structure.

In accordance with another exemplary embodiment, a method for fabricating a semiconductor device is provided. The method includes forming a layer of spacer material over a semiconductor region that includes a first gate electrode structure and a second gate electrode structure. A first portion of the layer covering the semiconductor region about the first gate electrode structure is masked with masking material. Carbon is implanted into a second portion of the layer covering the semiconductor region about the second gate electrode structure. The masking material is removed from the first portion. The layer is blanket etched to form a first sidewall spacer about the first gate electrode structure and a second sidewall spacer about the second gate electrode structure. The first sidewall spacer is wider than the second sidewall spacer.

In accordance with another exemplary embodiment, a method for fabricating a semiconductor device having a first structure and a second structure overlaying a semiconductor substrate is provided. The method includes depositing a sidewall spacer material overlaying the first and second structures. A mask is pattered overlaying the sidewall spacer material overlaying the first structure and exposing the sidewall spacer material overlaying the second structure. The sidewall spacer material overlaying the second structure is implanted with ions capable of altering the etch characteristics of the sidewall spacer material. The mask is removed. The sidewall spacer material is anisotropically etched to form sidewall spacers on the first structure and the second structure.

BRIEF DESCRIPTION OF THE DRAWINGS

Embodiments of the present invention will hereinafter be described in conjunction with the following drawing figures, wherein like numerals denote like elements, and wherein.

DETAILED DESCRIPTION

Figure 1:
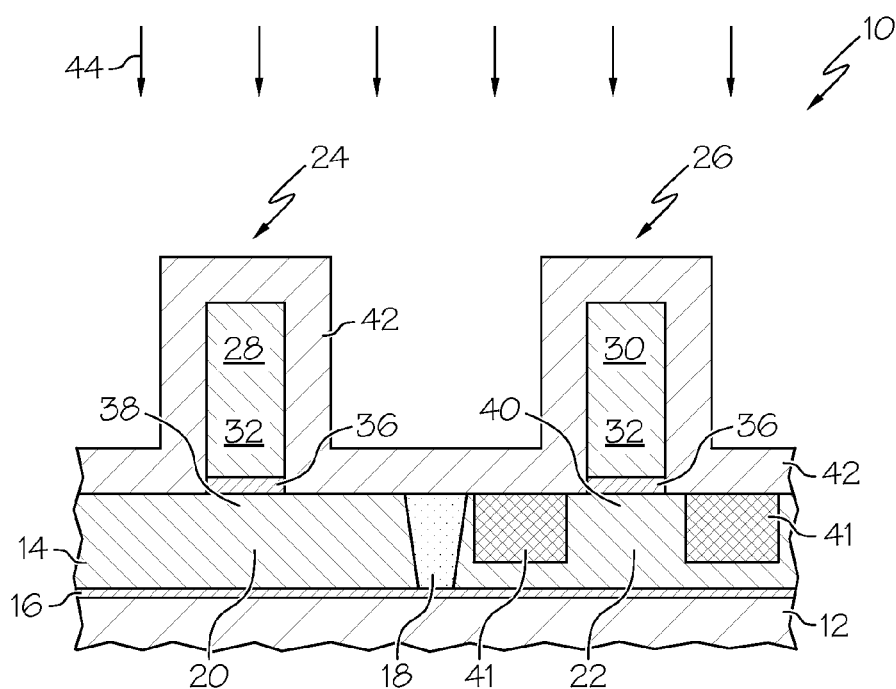
FIGS. 1-5 schematically illustrate, in cross-sectional views, a semiconductor device during stages of its fabrication in accordance with exemplary embodiments.

The following Detailed Description is merely exemplary in nature and is not intended to limit the invention or the application and uses of the invention. Furthermore, there is no intention to be bound by any theory presented in the preceding Background of the Invention or the following Detailed Description.

Various embodiments contemplated herein relate to methods for fabricating semiconductor devices. During intermediate stages of the fabrication of a semiconductor device, a layer of spacer material is formed over a semiconductor region that includes at least two gate electrode structures including a first gate electrode structure and a second gate electrode structure. In a preferred embodiment, the spacer material is silicon oxide, silicon nitride, or a combination of silicon oxide and silicon nitride. The first and second gate electrode structures may both be the control electrodes for NMOS transistors or for PMOS transistors, or one of the first and second gate electrode structures may be a control electrode for a NMOS transistor and the other a control electrode for a PMOS transistor.

Preferably, carbon is introduced into a portion of the layer of spacer material covering the semiconductor region about either the first gate electrode structure or the second gate electrode structure. In one example, the portion of the layer of spacer material covering the semiconductor region about the first gate electrode structure is masked with photoresist or other suitable masking material known to those skilled in the art. An ion implantation process is then used to implant carbon into the portion of the layer of spacer material about the second gate electrode structure. The inventors have found that by introducing a dose of carbon into the spacer material, the etching rate of the spacer material is increased when subjected to either a wet chemical etching process or dry etching process (e.g. plasma etching process). Preferably, carbon is implanted into the portion of the spacer material in an amount effective to increase the etching rate to be from about 10 to about 25% greater than the etching rate of the other portion of the spacer material that is not implanted with carbon. However, other suitable ions capable of altering the etch characteristics of the spacer material may be used instead of carbon or in combination with carbon.

After the masking material is used to prevent implanting carbon into the portion of the layer covering the semiconductor region about either the first or second gate electrode structure, the masking material is removed and the layer of spacer material, both implanted and not implanted is anisotropically blanket etched by using either a wet etching process or dry etching process to forms sidewall spacers about the first and second gate electrode structures. Because the etching rate of the portion of the spacer layer implanted with carbon is increased relative to the other portion, material is removed from the carbon implanted portion more rapidly than from the other portion. Thus, the first and second gate electrode structures will have sidewall spacers with different widths. In particular, if the portion of the layer of spacer material about the first gate electrode structure is implanted with carbon, then the sidewall spacer for the first gate electrode structure will be narrower than the sidewall spacer for the second gate electrode structure.

In an exemplary embodiment, the sidewall spacers for the first and second gate electrode structures are used as implantation masks for positioning N-type and/or P-type source and drain extensions and Halo implants for the first and second gate electrode structures. Channel regions are formed underneath each of the first and second gate electrode structures and extend to the corresponding source and drain regions. Because the width of the sidewall spacers for the first and second gate electrode structures are different, the source and drain extensions and Halo implants for the first and second gate electrode structures will have different offsets from their corresponding gate electrode structures, and accordingly, will define dimensionally different channel regions for the first and second gate electrode structures.

Referring to FIG. 1, a schematic depiction of a cross-sectional view of a semiconductor device 10 in an intermediate fabrication stage in accordance with an exemplary embodiment is provided. The semiconductor device 10 includes a substrate 12. Above the substrate 12 is a semiconductor layer 14, which may represent a silicon—containing semiconductor material that includes a high fraction of silicon in a crystalline state. As shown, a buried insulating layer 16 is positioned between the substrate 12 and the semiconductor layer 14, and the combination of layers 12, 14 and 16 represents a silicon-on-insulator (SOI). In other cases, the semiconductor layer 14 may be formed on a crystalline semiconductor material of the substrate 12, thereby providing a "bulk" configuration. It should be appreciated that an SOI configuration and a bulk configuration may be used concurrently in the device 10 in different device areas if considered advantageous.

In an exemplary embodiment, an isolation structure 18 is provided in the semiconductor layer 14. The isolation structure 18 defines corresponding active regions 20 and 22, which are to be understood as semiconductor regions having formed therein and/or receiving an appropriate dopant profile as required for forming transistor elements. As illustrated, the active regions 20 and 22 correspond to the active region of a transistor 24 and a transistor 26, which represent an N-channel transistor and a P-channel transistor, respectively. However, in alternative embodiments, the transistors 24 and 26 may both represent N-channel transistors or P-channel transistors, or represent a P-channel transistor and an N-channel transistor, respectively.

The transistors 24 and 26 include corresponding gate electrode structures 28 and 30. The gate electrode structures 28 and 30 may include the same or different electrode material or materials 32, such as silicon, silicon-germanium, metal-containing materials and the like. The gate electrode structures 28 and 30 also include a gate insulation layer 36 that separates the electrode material 32 from the channel regions 38 and 40 of the transistors 24 and 26. The channel regions 38 and 40 are formed in the active regions 20 and 22 extending underneath the gate electrode structures 28 and 30. The channel regions 38 and 40 may be composed of the same material as the active regions 20 and 22, or alternatively, one or both of the channel regions 30 and 40 may have a composition different from their respective active region 20 and/or 22, such as, for example, silicon germanium.

As shown, an embedded silicon-germanium (eSiGe) layer 41 is disposed in the active region 22 laterally adjacent to the gate electrode structure 30. The eSiGe layer 41 effectively acts as a strain-inducing layer, providing a compressive strain component to the channel region 40 and the underlying active region 22 to enhance the charge carrier mobility in the channel region 40 of the transistor 26.

The semiconductor device 10 as described in the foregoing paragraphs may be formed on the basis of the following processes. After forming the isolation structure 18, involving lithography, etch, deposition, planarization techniques and the like, the basic doping of the active regions 20 and 22 may be established, for instance, by ion implantation. Next, the gate electrode structures 28 and 30 may be formed by forming an appropriate layer stack and patterning the same on the basis of lithography and etch techniques. Next, the eSiGe layer 41 may be established by lithography, etch, selective epitaxial growth techniques and the like. In one example, the selective epitaxial growth technique may be established on the basis of a silicon and germanium-containing precursor gas and appropriate process parameters in order to obtain a selective deposition of a silicon-germanium alloy to form the eSiGe layer 41 while substantially avoiding a material deposition on the dielectric surfaces, such as the isolation structure 18, etc.

In an exemplary embodiment, a layer 42 of spacer material is formed over the active regions 20 and 22 and the gate electrode structures 28 and 30. In one example, the layer 42 is formed by a deposition process 44 that deposits a suitable spacer material over the active regions 20 and 22 and the gate electrode structures 28 and 30. Preferably, the spacer material is silicon oxide, silicon nitride, or a combination of silicon oxide and silicon nitride (e.g. a layer of silicon nitride covered by a layer of silicon oxide, or vice versa). Other suitable spacer materials known to those skilled in the art may also be used.

Figure 2:
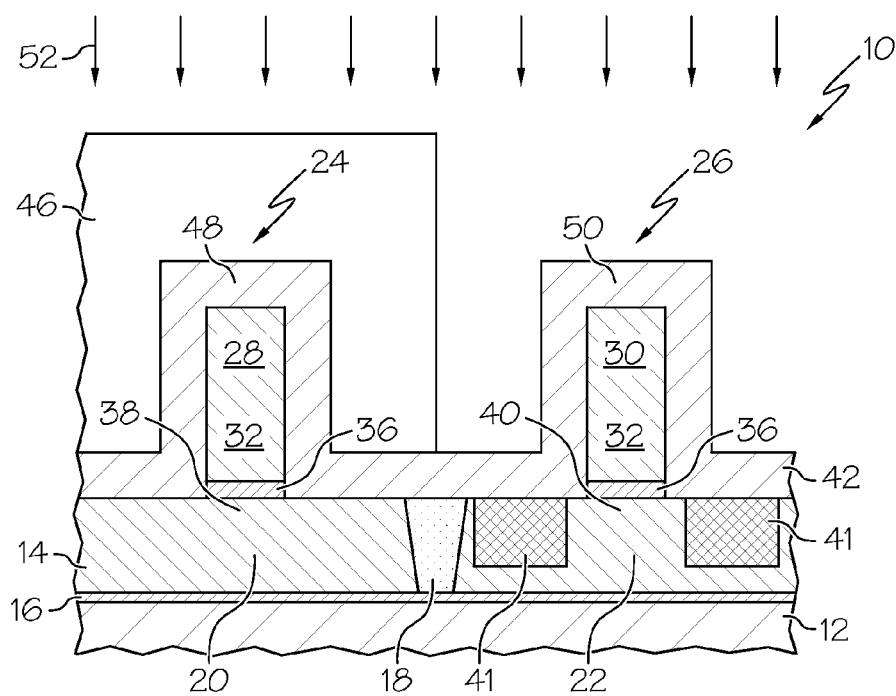

Referring to FIG. 2, a schematic depiction of the semiconductor device 10 in a further advanced fabrication stage in accordance with an exemplary embodiment is provided. An etch mask 46, such as a photoresist mask, is formed so as to cover a portion 48 of the layer 42 that covers the active region 20 and the gate electrode stack 28 while exposing the other portion 50 of the layer 42 that covers the active region 22, eSiGe layer 41 and the gate electrode stack 30. In an exemplary embodiment, carbon is introduced into the exposed portion 50 of the layer 42. In one example, carbon is implanted into the portion 50 of the layer 42 by an ion implantation process 52. Preferably, carbon is introduced into the portion 50 of the layer 42 at a dose of from about $1\times10^{11}$ to about $1\times10^{13}$ ions·cm$^{-2}$, and more preferably at about $1\times10^{12}$ ions·cm$^{-2}$, and at an accelerating voltage of from about 1 to about 5 KeV, and more preferably at about 3 KeV. In another example, the amount of carbon implanted into the exposed portion 50 of the layer 42 is effective to increase the etching rate of the portion 50 to be from about 10 to about 25% greater than the etching rate of the covered portion 48 of the layer 42 that is not implanted with the carbon.

Figure 3:
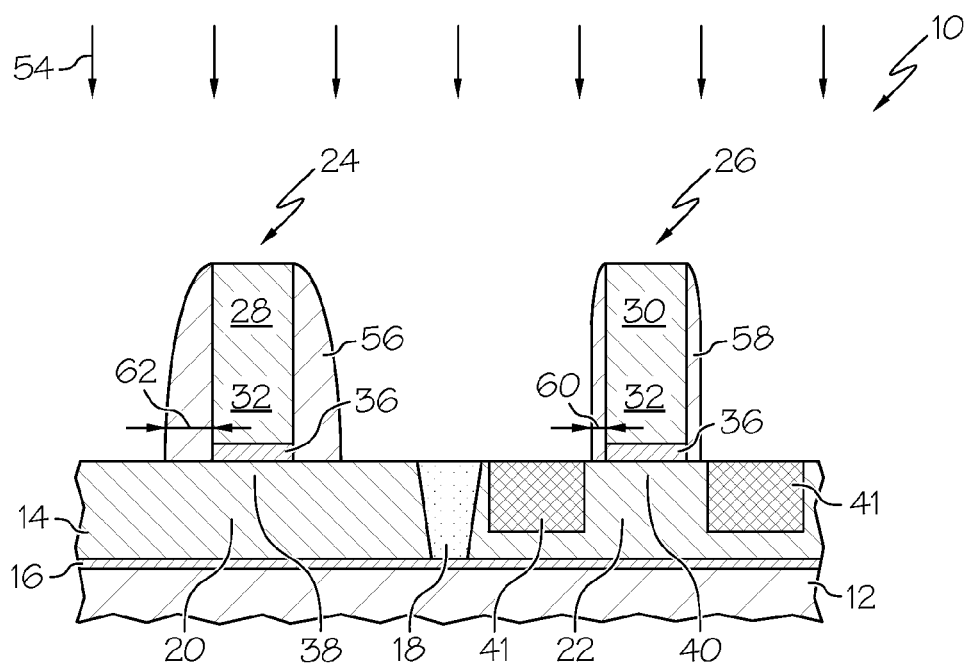

Referring to FIG. 3, a schematic depiction of the semiconductor device 10 in a further advanced fabrication stage in accordance with an exemplary embodiment is provided. The etch mask 46, which is illustrated in FIG. 2, is removed so that both portions 48 and 50 of the layer 42 are exposed.

Thereafter, the layer 42 is etched by an etching process 54 to form sidewall spacers 56 and 58 about the gate electrode structures 28 and 30, respectively. It should be appreciated that the sidewall spacers 56 and 58 may be formed on the basis of a substantially anisotropic etch behavior accomplished on the basis of a plasma assisted etch, while, in other cases, the sidewall spacers 56 and 58 may be formed by wet chemical etch chemistries, or on the basis of a combination of plasma assisted and wet chemical etch chemistries. In one embodiment, the etch process 54 is a wet chemical etch process that uses a dilute acid solution. In one example, the dilute acid solution is a dilute solution of hydrofluoric acid. Preferably, the dilute solution of hydrofluoric acid has a molar ratio of from about 1:200 to about 1:400 of hydrofluoric acid to diluent, and more preferably, of about 1:300 of hydrofluoric acid to diluent. The diluent may be water and/or ammonium fluoride, or any other suitable diluent known to those skilled in the art.

As illustrated, the sidewall spacers 58 about the gate electrode structure 30 have a narrower width 60 than the width 62 of the sidewall spacers 56 about the gate electrode structure 28. This is because the etching rate of the spacer material for the portion 50 of the layer 42 is greater than the etching rate of the spacer material for the portion 48 due to the implanted carbon in the portion 50, and therefore, the spacer material is removed more rapidly from the portion 50 about the gate electrode structure 30.

Figure 4:
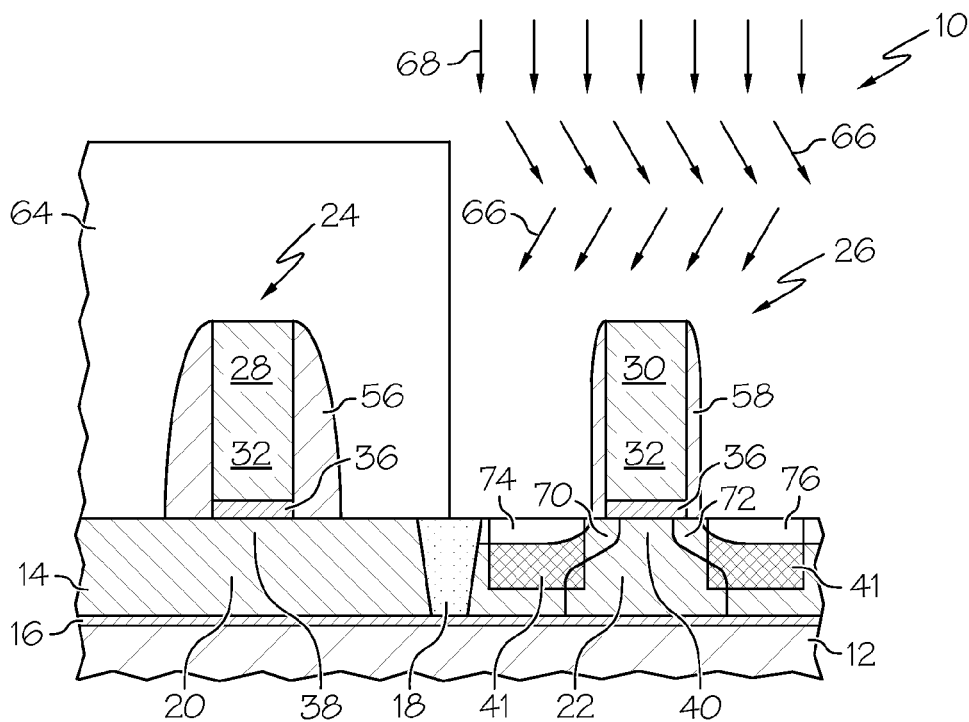

Referring to FIG. 4, a schematic depiction of the semiconductor device 10 in a further advanced fabrication stage in accordance with an exemplary embodiment is provided. As shown, an implantation mask 64, such as a photoresist mask, is formed so as to cover the active region 20, the gate electrode structure 28 and the sidewall spacers 56 while exposing the eSiGe layer 41, a portion of the active region 22, the gate electrode structure 30 and the sidewall spacers 58. Using the sidewall spacers 58 as an implantation mask, source and drain Halo implants 70 and 72 and extensions 74 and 76 are formed by ion implanting processes 66 and 68 into the semiconductor region laterally adjacent to the sidewall spacers 58 on the basis of well-established techniques.

Figure 5:
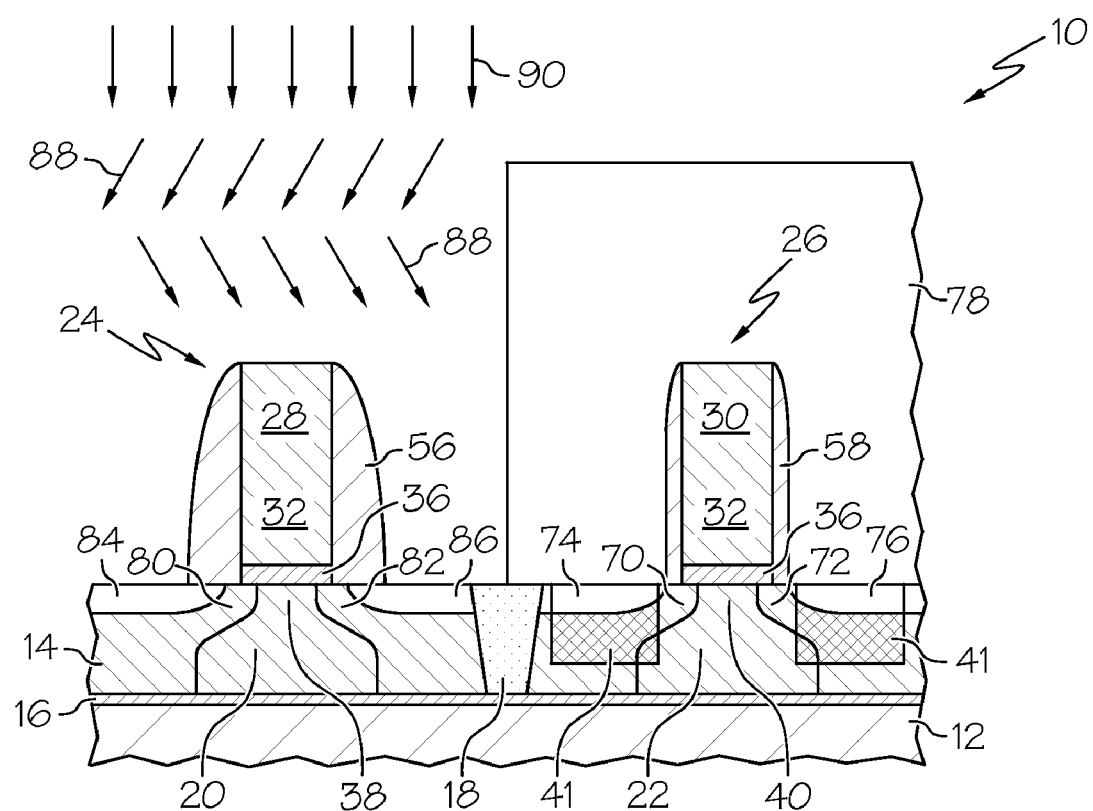

Thereafter and with reference to FIG. 5, the implantation mask 64 is removed and an implantation mask 78, such as a photoresist mask, is formed so as to cover the eSiGe layer 41, the portion of the active region 22, the gate electrode structure 30 and the sidewall spacer 58 while exposing the active region 20, the gate electrode structure 28 and the sidewall spacers 56. Using the sidewall spacer 56 as in ion implantation mask, source and drain Halo implants 80 and 82 and extensions 84 and 86 are formed by ion implanting processes 88 and 90 into the semiconductor region laterally adjacent to the sidewall spacers 56 on the basis of well-established techniques. Thereafter, the etch mask 78 may be removed for further processing of the semiconductor device 10, such as, for example, exposing the semiconductor device 10 to one or more annealing processes to activate the source and drain dopants, depositing of refractory metals, and subsequently, exposing the device 10 to one more heat treatments to initiate chemical reactions to form metal silicide therein as is well known in the art.

Accordingly, methods for fabricating semiconductor devices have been described. The various embodiments include during intermediate stages of the fabrication of the semiconductor device, forming a layer of spacer material over a semiconductor region that includes at least two gate electrode structures including a first gate electrode structure and a second gate electrode structure. Preferably, the spacer material is silicon oxide, silicon nitride, or a combination of silicon oxide and silicon nitride. The first and second gate electrode structures may both be the control electrodes for NMOS transistors or for PMOS transistors, or one of the first and second gate electrode structures may be a control electrode for a NMOS transistor and the other of the first and second gate electrode structures may be a control electrode for a PMOS transistor.

Preferably, carbon is introduced into a portion of the layer of spacer material covering the semiconductor region about either the first gate electrode structure or the second gate electrode structure. The inventors have found that by introducing a dose of carbon into a spacer material of a silicon oxide and/or a silicon nitride, the etching rate of the spacer material is increased. Preferably, carbon is implanted into the portion of the spacer material in an amount effective to increase the etching rate to be from about 10 to about 25% greater than the etching rate of the other portion of the spacer material that is not implanted with carbon. However, other suitable ions capable of altering the etch characteristics of the spacer material may be used instead of carbon or in combination with carbon.

The layer of spacer material is preferably anisotropically blanket etched by using either a wet etching process or dry etching process to forms sidewall spacers about the first and second gate electrode structures. Because the etching rate of the portion of the spacer layer implanted with carbon is increased relative to the other portion, material is removed from the spacer layer implanted with carbon more rapidly than from the other portion. Thus, the first and second gate electrode structures will have sidewall spacers with different widths. In particular, if the portion of the spacer layer about the first gate electrode structure is implanted with carbon, then the sidewall spacer for the first gate electrode structure will have a narrower width than the width of the sidewall spacer for the second gate electrode structure.

In an exemplary embodiment, the sidewall spacers for the first and second gate electrode structures are used as implantation masks for positioning N-type and/or P-type source and drain extensions and Halo implants for the first and second gate electrode structures. Channel regions are formed underneath each of the first and second gate electrode structures and extend to the corresponding source and drain regions. Because the width of the sidewall spacers for the first and second gate electrode structures are different, the source and drain extensions and Halo implants for the first and second gate electrode structures will have different offsets from their corresponding gate electrode structures, and accordingly, will define dimensionally different channel regions for the first and second gate electrode structures.

While at least one exemplary embodiment has been presented in the foregoing Detailed Description, it should be appreciated that a vast number of variations exist. It should also be appreciated that the exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention, it being understood that various changes may be made in the function and arrangement of elements described in an exemplary embodiment without departing from the scope of the invention as set forth in the appended Claims and their legal equivalents.

What is claimed is:

1. A method for fabricating a semiconductor device, the method comprising
    forming a layer of spacer material over a semiconductor region that includes a first gate electrode structure and a second gate electrode structure;
    introducing carbon into a portion of the layer covering the semiconductor region about the first gate electrode structure or the second gate electrode structure at a dose of from about $1\times10^{11}$ to about $1\times10^{13}$ ions·cm$^{-2}$ and at an accelerating voltage of from about 1 to about 5 KeV to increase an etching rate of the portion to be about 10 to about 25% greater than an etching rate of a portion of the layer not implanted with carbon; and
    etching the layer to form a first sidewall spacer about the first gate electrode structure and a second sidewall spacer about the second gate electrode structure.

2. The method according to claim 1, wherein forming the layer includes forming the layer of the spacer material that is selected from the group consisting of silicon oxide, silicon nitride, and combinations thereof.

3. The method according to claim 1, wherein introducing carbon includes introducing carbon into the portion of the layer by performing an ion implantation process.

4. The method according to claim 1, wherein introducing carbon includes introducing carbon into the portion of the layer at the dose of about $1\times10^{12}$ ions·cm$^{-2}$ and an accelerating voltage of about 3 KeV.

5. The method according to claim 1, wherein etching the layer includes wet etching the layer using a dilute acid solution.

6. The method according to claim 5, wherein etching the layer includes wet etching the layer using a dilute solution of hydrofluoric acid.

7. The method according to claim 1, wherein etching the layer includes dry etching the layer by performing a plasma etching process.

8. The method according to claim 1, wherein etching the layer includes etching the portion implanted with carbon and the portion not implanted with carbon to form the first sidewall spacer having a different width then the second sidewall spacer.

9. A method for fabricating a semiconductor device, the method comprising
    forming a layer of spacer material over a semiconductor region that includes a first gate electrode structure and a second gate electrode structure;
    masking a first portion of the layer covering the semiconductor region about the first gate electrode structure with masking material;
    implanting carbon into a second portion of the layer covering the semiconductor region about the second gate electrode structure at a dose of from about $1\times10^{11}$ to about $1\times10^{13}$ ions·cm$^{-2}$ and at an accelerating voltage of from about 1 to about 5 KeV to increase an etching rate of the second portion to be about 10 to about 25% greater than an etching rate of the first portion;
    removing the masking material from the first portion; and
    blanket etching the layer to form a first sidewall spacer about the first gate electrode structure and a second sidewall spacer about the second gate electrode structure, wherein the first sidewall spacer is wider than the second sidewall spacer.

10. The method according to claim 9, wherein forming the layer includes forming the layer of the spacer material that is selected from the group consisting of silicon oxide, silicon nitride, and combinations thereof.

11. The method according to claim 9, wherein implanting carbon includes implanting carbon into the second portion of the layer using an ion implantation process.

12. The method according to claim 9, wherein implanting carbon includes implanting carbon into the second portion of the layer at the dose of about $1\times10^{12}$ ions·cm$^{-2}$ and an accelerating voltage of about 3 KeV using an ion implantation process.

13. The method according to claim 9, wherein forming the layer includes forming the layer of the spacer material over the semiconductor region that includes the first gate electrode structure of a N-type transistor and the second gate electrode structure of a P-type transistor, and wherein implanting carbon includes implanting carbon into the second portion of the layer covering the semiconductor region about the second gate electrode structure of the P-type transistor.

14. The method according to claim 13, further comprising:
    forming N-type source and drain extensions and Halo implants into the semiconductor region adjacent to the first sidewall spacer; and
    forming P-type source and drain extensions and Halo implants into the semiconductor region adjacent to the second sidewall spacer.

15. The method according to claim 9, wherein forming the layer includes forming the layer of the spacer material over the semiconductor region that includes the first gate electrode structure of a P-type transistor and the second gate electrode structure of a N-type transistor, and wherein implanting carbon includes implanting carbon into the second portion of the layer covering the semiconductor region about the second gate electrode structure of the N-type transistor.

16. The method according to claim 15, further comprising:
    forming P-type source and drain extensions and Halo implants into the semiconductor region adjacent to the first sidewall spacer; and
    forming N-type source and drain extensions and Halo implants into the semiconductor region adjacent to the second sidewall spacer.

* * * * *